United States Patent
Bradbury et al.

(10) Patent No.: US 10,374,629 B1
(45) Date of Patent: Aug. 6, 2019

(54) COMPRESSION HARDWARE INCLUDING ACTIVE COMPRESSION PARAMETERS

(71) Applicant: International Business Machines Corporation, Armonk, NY (US)

(72) Inventors: Jonathan D. Bradbury, Poughkeepsie, NY (US); Anthony T. Sofia, Hopewell-Junction, NY (US); Matthias Klein, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/972,394

(22) Filed: May 7, 2018

(51) Int. Cl.
*H03M 7/40* (2006.01)
*H03M 7/30* (2006.01)

(52) U.S. Cl.
CPC ............ *H03M 7/40* (2013.01); *H03M 7/3086* (2013.01); *H03M 7/6058* (2013.01)

(58) Field of Classification Search
CPC ............................... H03M 7/40; H03M 7/3086
USPC .......................................... 341/51, 50, 67, 65
See application file for complete search history.

(56) References Cited

U.S. PATENT DOCUMENTS

| | | | |
|---|---|---|---|
| 6,449,689 B1 | 9/2002 | Corcoran et al. | |
| 7,624,394 B1 | 11/2009 | Christopher, Jr. | |
| 7,640,381 B1 | 12/2009 | Zhang et al. | |
| 7,765,521 B2 | 7/2010 | Bryant | |
| 7,890,727 B2 | 2/2011 | Mathews et al. | |
| 8,108,353 B2 | 1/2012 | Balachandran et al. | |
| 8,250,578 B2 | 8/2012 | Krishnamurthy et al. | |
| 8,275,909 B1 | 9/2012 | Rothstein | |
| 8,312,210 B2 | 11/2012 | Benhase et al. | |
| 8,359,186 B2 | 1/2013 | Sanesan et al. | |
| 8,610,604 B2 | 12/2013 | Glass et al. | |
| 8,712,978 B1 * | 4/2014 | Shilane | G06F 16/1744 707/693 |
| 8,943,024 B1 | 1/2015 | Gardner et al. | |
| 9,385,749 B1 * | 7/2016 | Nam | H03M 7/6082 |
| 9,442,754 B1 | 9/2016 | Tsirkin | |
| 9,514,146 B1 * | 12/2016 | Wallace | G06F 16/24561 |
| 9,716,754 B2 * | 7/2017 | Swift | H04L 67/1095 |
| 9,811,319 B2 | 11/2017 | Weinsberg et al. | |

(Continued)

FOREIGN PATENT DOCUMENTS

EP 2246786 A1 11/2010

OTHER PUBLICATIONS

Anthony T. Sofia et al., "Computer System Supporting Migration Between Hardware Accelerators Through Software Interfaces", U.S. Appl. No. 15/948,659, filed Apr. 9, 2018.

(Continued)

*Primary Examiner* — Peguy Jean Pierre
(74) *Attorney, Agent, or Firm* — Cantor Colburn LLP; William Kinnaman (57) ABSTRACT

A computer system includes a host system that runs an application. The application outputs a compression request to compress a data stream having an initial data-representation size, and which includes a plurality of individual data chunks. A hardware controller compresses the plurality of individual data chunks according to different encodings based on a compression ratio of each of the individual data chunks to generate a compressed data stream having a reduced data-representation size with respect to the initial data-representation size.

17 Claims, 6 Drawing Sheets

(56) References Cited

U.S. PATENT DOCUMENTS

| | | | |
|---|---|---|---|
| 2006/0212462 | A1 | 9/2006 | Heller et al. |
| 2009/0307711 | A1 | 12/2009 | Krishnamurthy et al. |
| 2010/0321218 | A1* | 12/2010 | Koratagere ......... H03M 7/3082 341/87 |
| 2011/0307907 | A1 | 12/2011 | Hwang et al. |
| 2013/0135122 | A1* | 5/2013 | Glass ................. H03M 7/6076 341/65 |
| 2013/0135123 | A1* | 5/2013 | Golander ............ H03M 7/6076 341/65 |
| 2013/0268497 | A1 | 10/2013 | Baldwin et al. |
| 2013/0307709 | A1* | 11/2013 | Miller ................. H03M 7/3093 341/87 |
| 2014/0351229 | A1 | 11/2014 | Gupta |
| 2014/0351811 | A1 | 11/2014 | Kruglick |
| 2016/0173123 | A1 | 6/2016 | Gopal et al. |
| 2017/0132241 | A1 | 5/2017 | Haverkamp et al. |
| 2017/0212487 | A1 | 7/2017 | Gupta et al. |
| 2017/0220404 | A1 | 8/2017 | Polar Seminario |

OTHER PUBLICATIONS

Anthony T. Sofia et al., "Multi-Mode Compression Acceleration", U.S. Appl. No. 15/948,678, filed Apr. 9, 2018.

Anthony T. Sofia, "Computer System Supporting Multiple Encodings With Static Data Support", U.S. Appl. No. 15/938,000, filed Mar. 28, 2018.

List of IBM Patents or Patent Applications Treated as Related; (Appendix P), Filed May 7, 2018; 2 pages.

Lettieri et al., "Data Compression in the V. 42bis Modems." WESCON/94. Idea/Microelectronics. Conference Record. IEEE, 1994. pp. 398-403.

Singh et al., "Enhancing LZW Algorithm to Increase Overall Performance." India Conference, 2006 Annual IEEE. IEEE, 2006. (4 pages).

Augonnet et al., "Data-Aware Task Scheduling on Multi-Accelerator Based Platforms," 2010 IEEE 16th International Conference on Parallel and Distributed Systems, pp. 291-298.

Campoalegre, Volumetric Medical Images Visualization on Mobile Devices. MS thesis. Universitat Politécnica de Catalunya, 2010.

D. Syrivelis et al., "On emulating hardware/software co-designed control algorithms for packet switches," SIMUTools '14: Proceedings of the 7th International ICST Conference on Simulation Tools and Techniques, pp. 132-141.

E. Horta et al., "Dynamic hardware plugins in an FPGA with partial run-time reconfiguration," DAC '02 Proceedings of the 39th annual Design Automation Conference, pp. 343-348.

J. Rapp et al., "Dynamically Configured Hardware Accelerator Functions," ip.com Disclosure No. IPCOM000171311D.

Kachouri et al., "Hardware design to accelerate PNG encoder for binary mask compression on FPGA." SPIE 9400, Real-Time Image and Video Processing. 2015.

Mauve, "Protocol enhancement and compression for x-based application sharing." University of Mannheim (1997): 11-12.

Meng et al., "Investigating applications portability with the Uintah DAG-based runtime system on PetaScale supercomputers," SC '13 Proceedings of the International Conference on High Performance Computing, Networking, Storage and Analysis, Article No. 96.

Nikkanen, . "uClinux as an embedded solution." Diss, Turku, Salo, Finland (2003).

Planas et al., "AMA: Asynchronous management of accelerators for task-based programming models," Procedia Computer Science 51 (2015): 130-139.

S. Chai et al., "Reconfigurable Streaming Architectures for Embedded Smart Cameras," ip.com Disclosure No. IPCOM000141061D.

Schroeter et al., "Dynamic configuration management of cloud-based applications," SPLC'12 Proceedings of the 16th International Software Product Line Conference—vol. 2, pp. 171-178.

Teimouri et al., "Revisiting accelerator-rich CMPs: challenges and solutions," DAC '15 Proceedings of the 52nd Annual Design Automation Conference, Article No. 84.

* cited by examiner

100
COMPRESSION HARDWARE INCLUDING ACTIVE COMPRESSION PARAMETERS

BACKGROUND

The present invention relates to digital computer systems, and more particularly, to digital data compression schemes employed in digital computer systems.

Digital computer systems perform data compression to realize a more efficient use of finite storage space. The computer system typically includes a hardware component referred to as a compression accelerator, which accepts work requests or data requests from the host system to compress or decompress one or more blocks of the requested data. These compression accelerators often utilize a "DEFLATE" algorithm, which is a lossless compression scheme that combines the Lempel-Ziv (e.g., LZ77) compression algorithm, along with a Huffman algorithm to perform the compression. The computed output from the Huffman algorithm can be viewed as a variable-length code table for encoding a source symbol (such as a character in a file). The Huffman algorithm derives this table from the estimated probability or frequency of occurrence (weight) for each possible value of the source symbol.

SUMMARY

According to a non-limiting embodiment, a computer system includes a host system that runs an application. The application outputs a compression request to compress a data stream having an initial data-representation size, and which includes a plurality of individual data chunks. A hardware controller compresses the plurality of individual data chunks according to different encodings based on a compression ratio of each of the individual data chunks to generate a compressed data stream having a reduced data-representation size with respect to the initial data-representation size.

According to another non-limiting embodiment, a computer-implemented method is provided to control a computer system to compress data. The method comprises outputting, via an application running on the computer system, a compression request to compress a data stream having an initial data-representation size. The method further comprises generating a compressed data stream having a reduced data-representation size with respect to the initial data-representation size. The compressed data stream is generated by compressing, via a hardware controller of the computer system, a plurality of individual data chunks according to different encodings based on a compression ratio of each of the plurality of individual data chunks.

According to another non-limiting embodiment, a computer program product is provided to control a computer system to compress data. The computer program product comprises a computer readable storage medium having program instructions embodied therewith. The program instructions are executable by an electronic computer processor to perform operations comprising outputting, via an application running on the computer system, a compression request to compress a data stream having an initial data-representation size, and generating a compressed data stream having a reduced data-representation size with respect to the initial data-representation size. The compressed data stream is generated by compressing, via a hardware controller of the computer system, a plurality of individual data chunks according to different encodings based on a compression ratio of each of the plurality of individual data chunks Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, the reduction in data-representation size produced by an applied data compression algorithm is typically referred to as the compression ratio (C/R). The compression ratio can be defined as the ratio between the uncompressed size and compressed size. Thus, as the compression ratio increases, a more efficient use of the computer system's storage space is achieved thereby improving the overall performance of the computer system.

When compressing data, in particular when using the DEFLATE standard, one aspect that can affect the compression ratio is the derivation or calculation of the dynamic Huffman table used to perform a particular compression event. Recalculating the Huffman table requires additional processing as well as additional storage in the compression data stream to store the Huffman table. Consequently, each additional calculation for generating a new dynamic Huffman table can cause a reduction in the compression ratio as well as the compressors throughput. With this in mind, conventional computer systems implementing DEFLATE encoding schemes, or other compression schemes relying on dynamic Huffman encoding for that matter, aim to maintain the same dynamic Huffman table throughout the compression event, e.g., throughout the complete compression of data requested by an application.

Turning now to an overview of the aspects of the inventive teachings, one or more embodiments address the above-described shortcomings of the prior art by providing a digital computer system that actively changes the dynamic Huffman table used to compress a given data stream based on a changing condition such as, for example, the compression ratio. In one or more embodiments, the compression ratio for each input block of a data stream is determined and different dynamic Huffman tables are calculated based on the current compression ratio associated with the current input block or data chunk being compressed. In this manner, different dynamic Huffman tables can be actively calculated and utilized when compressing a given data stream or file to improve throughput (i.e., maintain throughput above a throughput threshold), while minimizing the number Huffman calculations to maintain a target compression ratio (i.e., to maintain the compression ratio above a C/R threshold).

Figure 1:
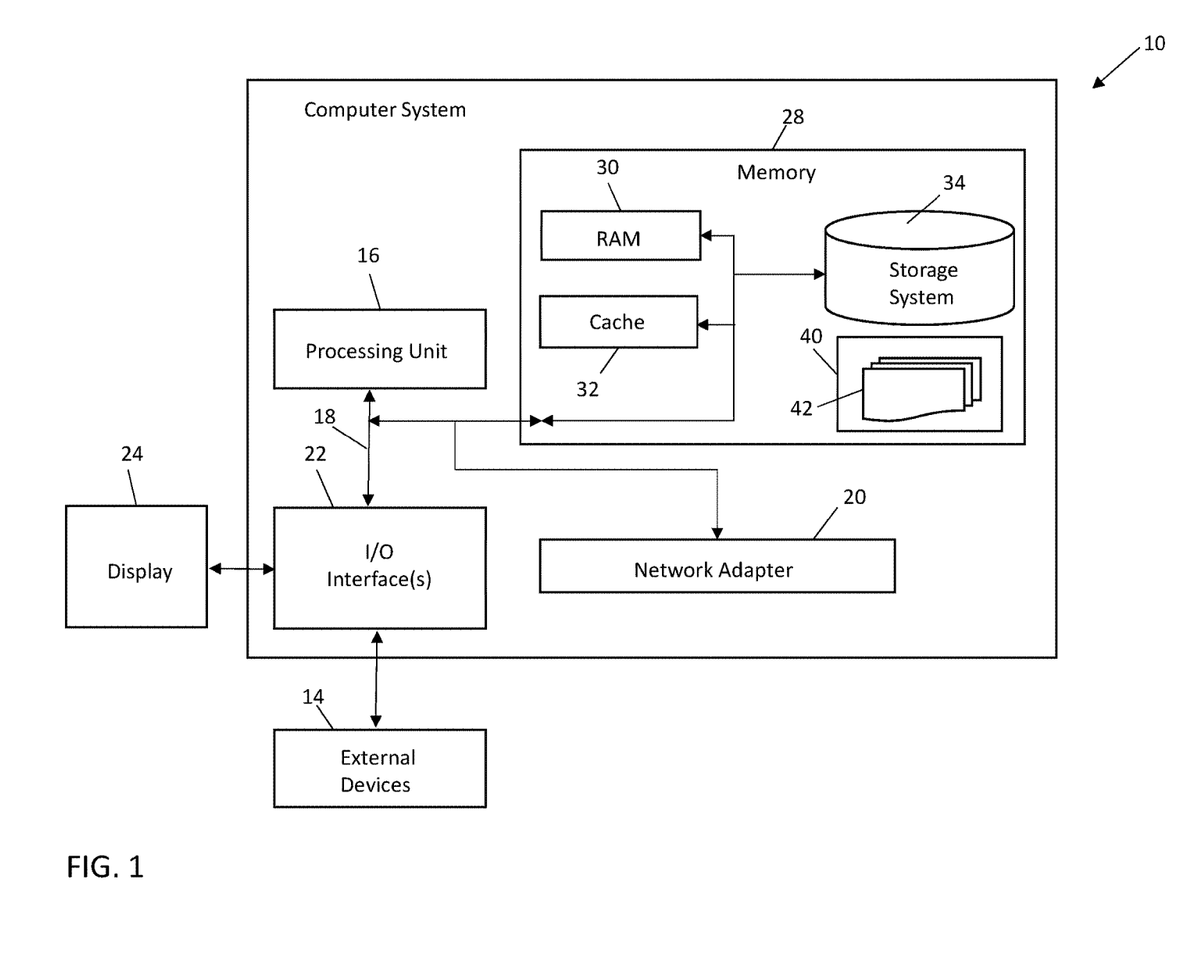
FIG. 1 is a block diagram illustrating a computer system which is capable of compressing data in accordance with various embodiments of the invention.

With reference now to FIG. 1, a computer system 10 is illustrated in accordance with a non-limiting embodiment of the present disclosure. The computer system 10 may be based on the z/Architecture, for example, offered by International Business Machines Corporation (IBM). The architecture, however, is only one example of the computer system 10 and is not intended to suggest any limitation as to the scope of use or functionality of embodiments described herein. Regardless, computer system 10 is capable of being implemented and/or performing any of the functionality set forth hereinabove.

Computer system 10 is operational with numerous other general purpose or special purpose computing system environments or configurations. Examples of well-known computing systems, environments, and/or configurations that may be suitable for use with computer system 10 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed computing environment, program modules may be located in both local and remote computer system storage media including memory storage devices.

As shown in FIG. 1, computer system 10 is shown in the form of a general-purpose computing device, also referred to as a processing device. The components of computer system may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that is accessible by computer system/server 10, and it includes both volatile and non-volatile media, removable and non-removable media.

System memory 28 can include computer system readable media in the form of volatile memory, such as random access memory (RAM) 30 and/or cache memory 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, and data archival storage systems, etc.

Figure 2:
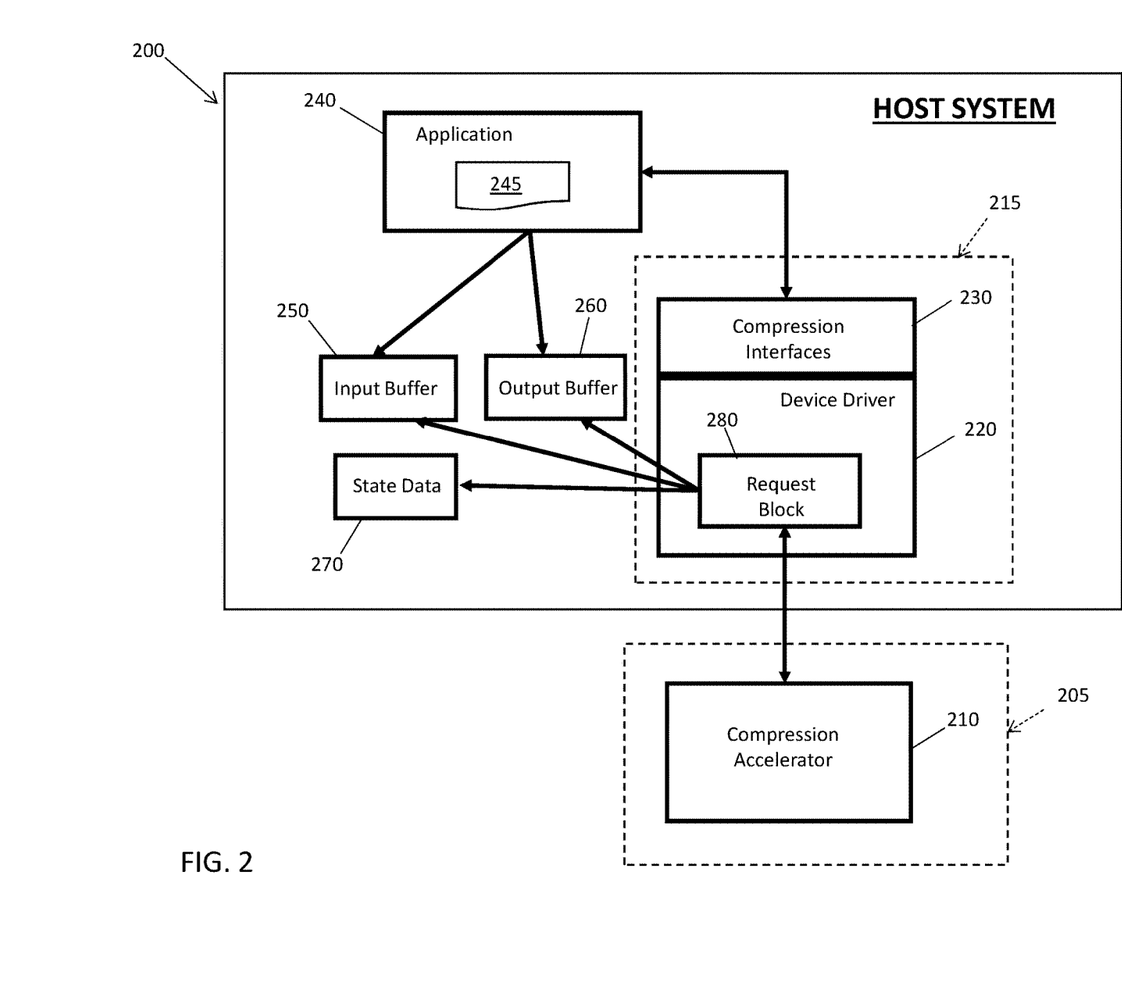
FIG. 2 is a block diagram of a host system in signal communication with a hardware component according to a non-limiting embodiment.

With reference to FIG. 2, a host system 200 is illustrated in signal communication with one or more computing hardware components 205 according to a non-limiting embodiment. The host system 200 and the hardware component 205 can be implemented using the processing unit 16 in combination with the other components of the computer system 10 described in FIG. 1.

The hardware component 205 includes, but is not limited to, an electronic hardware controller installed with a compression accelerator 210. According to a non-limiting embodiment, the compression accelerator 210 can be shared among multiple host systems, but for simplicity only one host system 200 is shown in FIG. 2. The interaction between the compression accelerator 210 and the host system 200 can be controlled by the host system's operating system (OS) 215. The host OS 215 includes a device driver 220 capable of providing one or more compression interfaces 230.

The host system 200 is capable of running one or more applications 240 to facilitate data compression. The application 240 is installed with one or more compression libraries 245. Although some embodiments may implement a "zlib", the disclosure is of course not limited to any particular library. The compression library 245 is compatible with the compression interfaces 230 of the OS 215 and informs the compression accelerator 210 (e.g., via one or more parameter data blocks) of the specific encoding scheme to be used to compress the requested data or data stream. Communication between the OS 215, application 240 and/or compression library 245 is facilitated through one or more data request blocks 280, as well as an understanding of the compressed encoding to be used to compress blocks of data, i.e., the input blocks or chunks of data defining the data stream to be compressed.

In one or more embodiments, uncompressed data is obtained by the application 240 and is passed by a pointer to the compression library 245. The compression library 245 passes the pointer to the operating system 215 for the data buffer 250. In turn, the operating system 215 passes data from the input date buffer 250 indicated by the pointer to the hardware 205, and the compression accelerator 210 will perform an initial data compression on the data provided by the application 240. The initial compressed data can be stored in the output buffer 260, and then passed by a pointer between the OS 215 and the compression library 245. In the event a flush operation is performed, then the compression library 245 possess that compressed output buffer of data that it can operate on. The operations of the compression library 245 include performing an additional compression operation such as a "DEFLATE" operation, for example, on the compressed data obtained from the output buffer 260 to generate final compressed data. The "DEFLATE" operation can include injecting control data, such as an EOB symbol, into the EOB of the compressed data obtained from the output buffer 260.

Various types of compression algorithms can be utilized in the computer system 10 such as, for example, an adaptive lossless data compression (ALDC) family of products which utilize a derivative of Lempel-Ziv encoding to compress data. As a general compression technique, the Lempel-Ziv algorithm integrates well into systems required to handle many different data types. This algorithm processes a sequence of bytes by keeping a recent history of the bytes processed and pointing to matching sequences within the history. Compression is achieved by replacing matching byte sequences with a copy pointer and length code that together are smaller in size than the replaced byte sequence.

The compression algorithm can also include the "DEFLATE" compression format, which uses a combination of the LZ77 algorithm (which removes repetitions from the data) and Huffman coding. The Huffman encoding is entropy encoding that is based on a "Huffman tree". In order to Huffman encode and decode data, a system must know in advance that the Huffman tree is being used. In order to accommodate decompression (e.g., an "Inflate" operation), the Huffman tree or Huffman table is written into a given compressed block (e.g., at the header of every compressed block) and/or is loaded into a request block that is returned to the application. In one embodiment, two options are provided for Huffman table in the Deflate standard. One option is a "static" table, which is a single hard-coded Huffman able, known to all compressors and decompressors. The advantage of using this static table is that its description does not have to be written in the header of a compressed block, and is ready for immediate decompression. On the other hand, "dynamic" Huffman tables are tailored for the data block at hand and an exact description of the dynamic table must, therefore, be returned back to the application, either using the compressed data block or the data request block initially output by the application.

The Huffman encoding scheme may also use a variable-length code table based on entropy to encode source symbols, and as previously mentioned, is defined either as either static or dynamic. In static Huffman coding, each literal or distance is encoded using a fixed table (SHT) that is defined in the RFC. In dynamic Huffman coding, however, special coding tables (DHT) are constructed to better suit the statistics of the data being compressed. In most cases, using DHT achieves better compression ratio (e.g., quality) when compared to SHT, at the expense of degrading the compression rate (e.g., performance) and adding design complexity. The static and dynamic Huffman encoding methods best reflect the built-in tradeoff between compression rate and ratio. The static Huffman method may achieve a lower compression ratio than is possible. This is due to using a fixed encoding table regardless of the content of the input data block. For example, random data and a four-letter DNA sequence would be encoded using the same Huffman table.

The compression library 245 can be implemented in the application 240 as a software library used for deflation/inflation and can be an abstraction of a compression algorithm. The compression library 245 obtains this compressed data, and perform an additional "DEFLATE" operation on the compressed data to generate a final compressed data. The "DEFLATE" operation includes injecting control data, such as an EOB symbol, into the EOB.

To compress the requested data, the application 240 outputs one or more compression requests to the compression interface 230 of the OS 215. On each request, the application 240 can supply the input buffer 250 with the data to be processed. The output buffer 260 can be utilized to store the processed data results and can be accessed by the application 240. On the first request of a data stream, the device driver 220 of the OS 215 receives a data control block 280 from compression library 245 which includes a stream state 270 for the data stream and may exist for the life of the data stream according to an embodiment. Following each request, the device driver 220 can analyze the data request block 280, which can point to the stream state 270, the input buffer 250, and the output buffer 260. In one or more embodiments, the device driver 220 can determine the compression ratio of the current data compression request or a current chunk of data included in the data correspond to the compression request by monitoring the number of bytes that are generated according to a compression, for a given number of input bytes (i.e., non-compressed data chunk). In other words, the device driver can compare the number of compressed bytes in a compressed block to the number of bytes in an uncompressed data chunk to determine the compression ratio. In at least one embodiment, the determined compression ratio can be stored in the stream state 270 so that on the next request a determination can be made as to whether a new dynamic Huffman table should be calculated.

To begin processing the compression request, the compression accelerator 210 reads the data request block 280 and processes the data in the input buffer 250 to generate compressed or and/or decompressed data using an installed compression algorithm (e.g., LZ77 and Huffman coding). The resulting compressed data can be saved in the output buffer 260. According to a non-limiting embodiment, the compression accelerator 210 can also save an updated stream state 270 when directed by the device driver 220.

Figure 3:
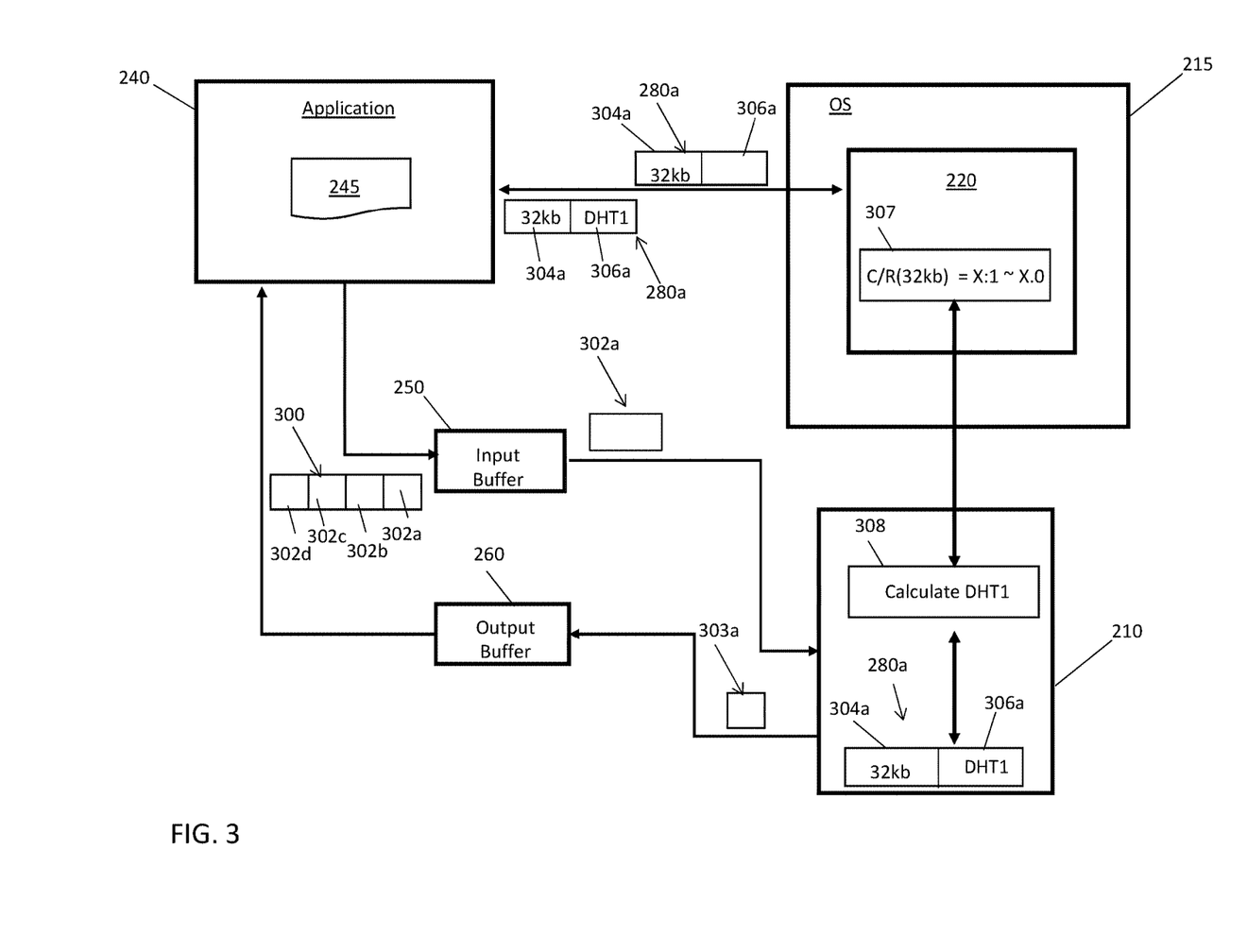
FIG. 3 is a block diagram illustrating compression of a first block of a data stream according to a first dynamic Huffman table generated based on a first compression ratio of the first input block.
Figure 4:
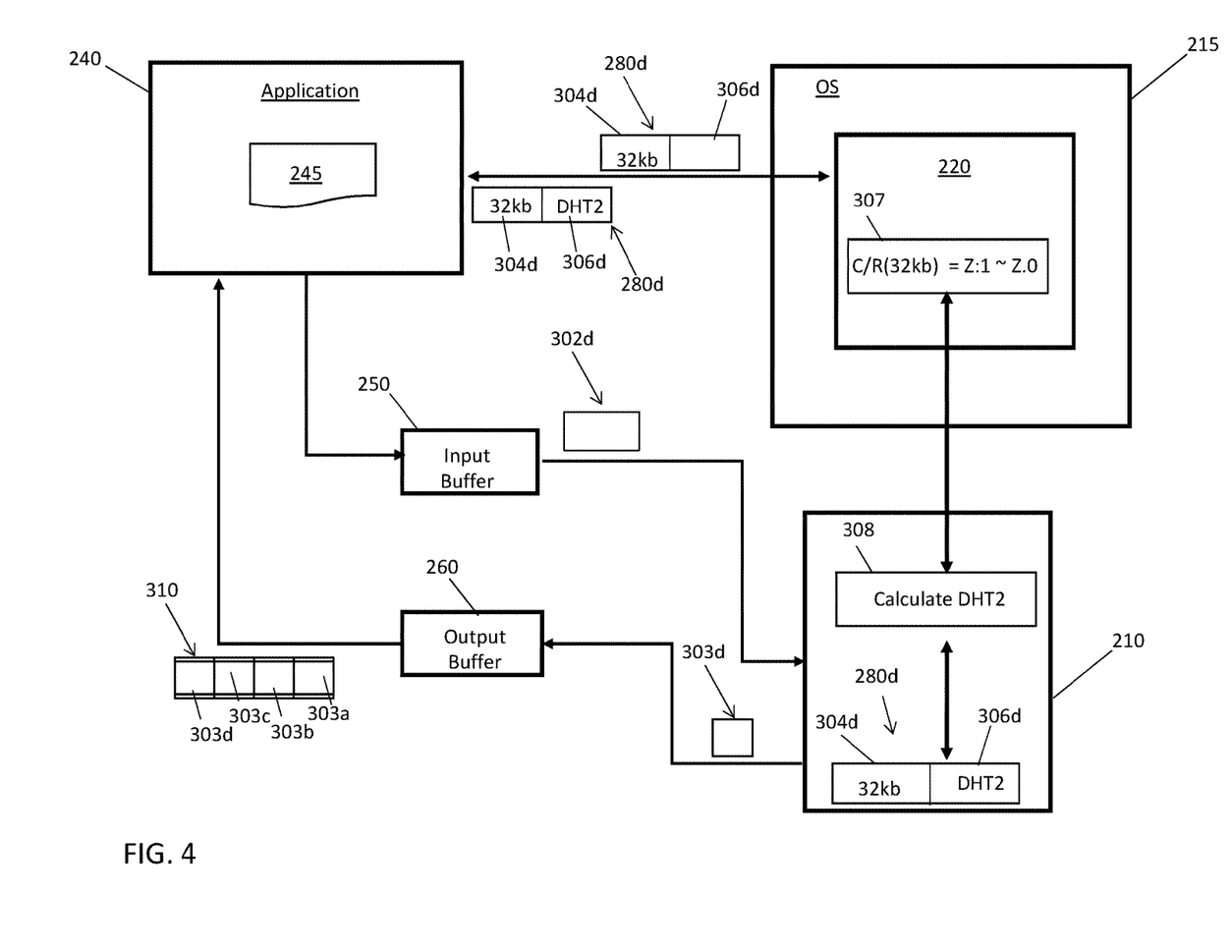
FIG. 4 is a block diagram illustrating compression of a second block of the data stream according to a second dynamic Huffman table generated based on a second compression ratio of the second input block.

Turning now to FIGS. 3 and 4, block diagrams illustrate a status communication exchange between a given application 240 and the OS 215 according to a non-limiting embodiment. In FIG. 3, the application 240 identifies data 300 or a data stream 300 to be compressed. The data 300 is segmented into individual data blocks or chunks of data 302a, 302b, 302c and 302d (e.g., 32 KB data chunks), which are loaded into the input buffer 250.

The application 240 also delivers a data request block 280a to the OS 215. The data request block 280a includes a first data field 304a and a second data field 306a. The value stored in the first data field 304a indicates the total "window" or "chunk" of data (e.g. 32 KB) to be compressed. The second data field 306a is reserved for storing a data value indicating the dynamic Huffman table that is calculated based on the data chunk 302a, 302b, 302c and 302d to be compressed. Accordingly, the value stored in the second data field 306a can serve as encoding identification data indicating the calculated dynamic Huffman table corresponding to a given subsequently compressed data chunk.

The OS 215 passes the data request block 280a to the device driver 220. The device driver 220 includes a compression ratio calculator 307. The compression ratio calculator 307 is configured to calculate the compression ratio (C/R) of a chunk of a data 302a, 302b, 302c and 302d to be compressed. The compression ratio calculator 307 determines the particular chunk of data (e.g., 302a) to compress based on the first data field 304a. The compression ratio of a chunk of data is often notated as an explicit ratio, X:1 (e.g., "5" to "one"), or as an implicit ratio, X/1. The compression ratio may also be calculated as the original size (numerator) compared with the compressed size (denominator), measured in unitless data as a size ratio of 1.0 or greater.

The determined compression ratio (e.g., X:1 or X.0) is output to the accelerator 210. The accelerator 210 includes a Huffman table calculator 308, which calculates the dynamic Huffman table (e.g., DHT1) for compressing the current chunk of data (e.g., 302a) based on the compression ratio (e.g., X:1 or X.0) received from the device driver 220. The current chunk of data (e.g., 302a) is compressed using the corresponding dynamic Huffman table (e.g., DHT1), and the resulting compressed data block 303a is loaded into the output buffer 260. The accelerator 210 can loads the calculated dynamic Huffman table (e.g., DHT1) into the second data field 306a of the data request block 280a. The data request block 280a can then be returned to the application 240, thereby indicating the dynamic Huffman table (e.g., DHT1) corresponding to a particular compressed data block (e.g., 303a). In another embodiment, the compressed data block 303a can be loaded into the corresponding dynamic Huffman table (e.g., DHT1), and accessed by the application 240 when analyzing the compressed data block 303a.

Turning to FIG. 4, the application 240 delivers a data request block 280d corresponding to the final data chunk 302d of the requested data 300 (shown in FIG. 1) to the OS 215. The data field 304d of the data request block 280d informs the device driver 220 to calculate compression ratio of data chunk 302d. The accelerator 210 also obtains the final data chunk 302d from the input buffer 250. Unlike the case of data chunk 302a described above, the compression ratio calculator 307 actively determines a different compression ratio (e.g., C/R=Z:1 or Z.0) based on data chunk 302d.

The determined compression ratio (e.g., Z:1 or Z.0) is output to the accelerator 210. The Huffman table calculator 308 actively calculates a new or updated dynamic Huffman table (e.g., DHT2) for compressing the current chunk of data 302d based on the compression ratio (e.g., Z:1 or Z.0). The current chunk of data 302d is compressed using the new or updated dynamic Huffman table (e.g., DHT2), and the resulting compressed data block 303d is loaded into the output buffer 260. In at least one non-limiting embodiment, the accelerator 210 utilizes a newly calculated dynamic Huffman table (e.g., DHT2) to compress a current data chunk when the compression ratio is less than a C/R threshold value, and utilizes the previously calculated dynamic Huffman table (e.g., DHT1) to compress the current data chunk when the compression ratio is equal to or exceeds the C/R threshold value. In this manner, the number of newly calculated dynamic Huffman tables can be held to a minimum.

The accelerator 210 also loads the new or updated dynamic Huffman table (e.g., DHT2) into the second data field 306d of the data request block 280d. The data request block 280d can then be returned to the application 240, thereby actively indicating the new or updated dynamic Huffman table (e.g., DHT2) corresponding to the compressed data block 303d. The application 240 also obtains the completed compressed data 310 from the output buffer 260. Accordingly, the encoding (e.g., the dynamic Huffman table) can be actively updated in order to maintain a target compression ratio. For example, the device driver 220 can determine a target compression ratio to maintain throughout the compression of the requested data stream 300 (i.e., the plurality of individual data chunks), and the accelerator 210 continuously changes the dynamic Huffman table (e.g., calculates a new dynamic Huffman table) to compress the individual data chunks (e.g., 302a, 302b, 302c, 302d, 302n) and generate compressed blocks (e.g., 303a, 303b, 303c, 303d, 303n) while maintaining the target compression ratio.

In at least one embodiment, a larger data file corresponding to a compression request issued by the application 240 can be broken into several individual requests (e.g., corresponding to individual data blocks 280a-280n) that will initiate compression of corresponding individually data chunks (e.g., 302a-302n) as described above. As each data chunk (e.g., 302a-302n) is processed, the compression ratio for a given data chunk can be compared against a compression ratio assigned to the (e.g., the requested data or data stream). For instance, a given data chunk may have compressed worse (e.g., 20% worse) than the average for the file thus far based on either a user specified or a learning threshold. When such a scenario is detected, the encoding (e.g., the dynamic Huffman table) used for the requested data can be actively re-calculated.

Figure 5A:
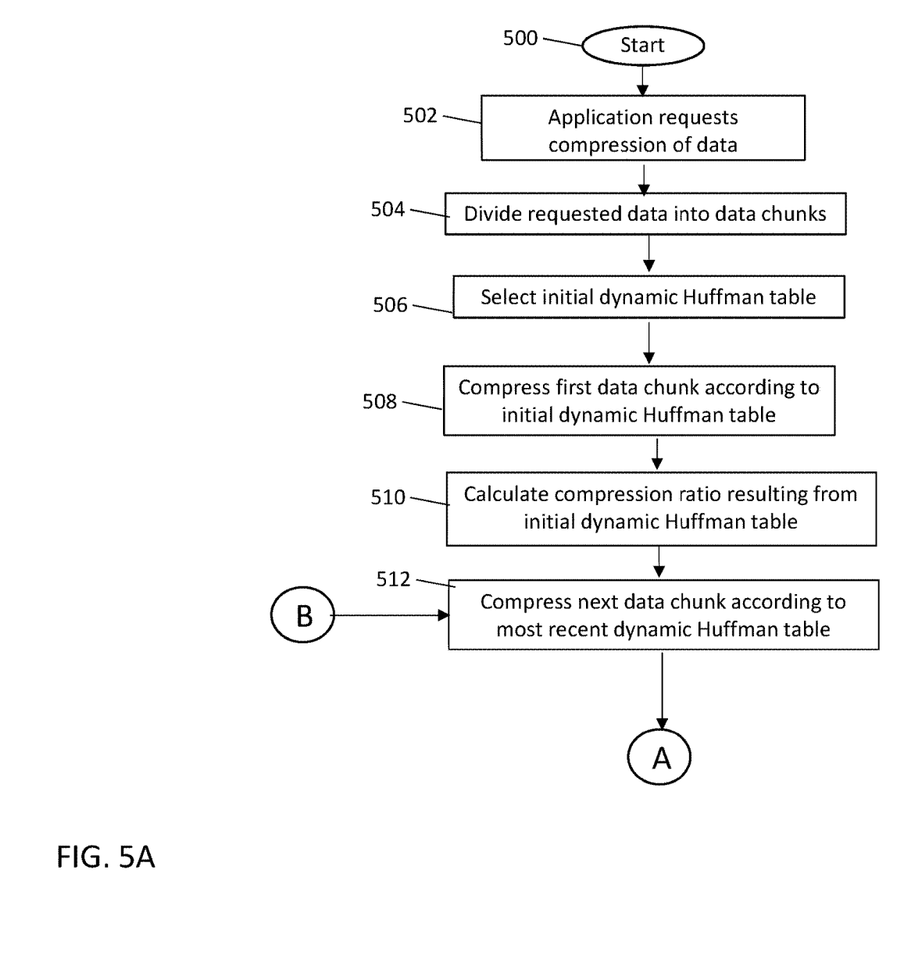
FIGS. 5A and 5B depict a flow diagram illustrating a method of controlling data compression performed by a computer system according to a non-limiting embodiment.
Figure 5B:
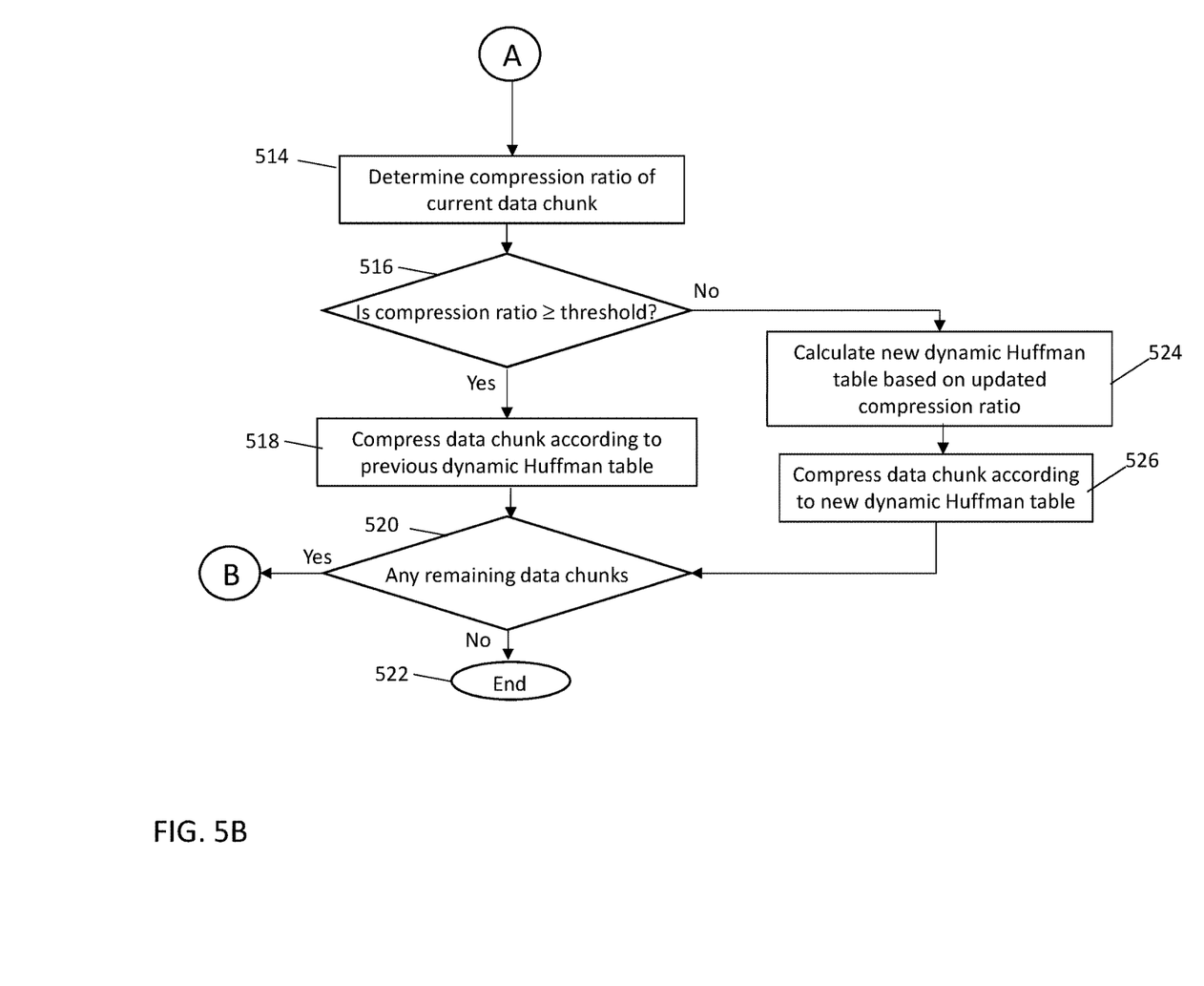

With reference now to FIGS. 5A and 5B, a method of compressing data compression performed by the computer system 10 is illustrated according to a non-limiting embodiment. The method begins at operation 500, and at operation 502 an application running on a processor included in the computer system issues a request to compress data or a data stream. At operation 504, the data to be compressed is divided into a plurality of input data blocks or individual data chunks. At operation 506, an initial dynamic Huffman table is selected, and the first data chunk is compressed using the initial dynamic Huffman table at operation 508. At operation 510, a compression ratio is determined corresponding to compression of the first data chunk using the initial dynamic Huffman table. At operation 512, the next data chunk included in the requested data stream is compressed according to the initial dynamic Huffman table, and the compression ratio of the current data chunk is determined at operation 514 (see FIG. 5B).

At operation 516, a determination is made as to whether the compression ratio corresponding to the current data chunk is equal to or exceeds a threshold value. When the compression ratio is equal to or exceeds to the threshold value, the method proceeds to operation 518 and the current data chunk is compressed using the previously calculated dynamic Huffman table (e.g., the Huffman table calculated at operation 506), or most the recently calculated dynamic Huffman table. At operation 520, a determination is made as to whether there are any remaining data chunks to be compressed. When no further data chunks exist (i.e., all the data chunks of the requested data file have been compressed), the method ends at operation 522. When, however, one or more remaining data chunks exist, than the next data chunk is compressed using the most recently calculated dynamic Huffman table at operation 512, and the compression ratio of the current data chunk is determined at operation 514.

Returning to operation 516, when the compression ratio resulting from the most recently calculated Huffman table is less than the threshold value, a new dynamic Huffman table is calculated at operation 524. At operation 526, the current the data chunk is compressed using the newly calculated dynamic Huffman table. At operation 520, a determination is made as to whether there are any remaining data chunks to be compressed. When no further input data chunks exist (i.e., all the input data chunks of the requested data file have been compressed), the method ends at operation 522. Otherwise, the method returns to operation 512 and continues as described above.

As described herein, various non-limiting embodiments provide a computer system that can actively calculate and utilize different dynamic Huffman tables when compressing a given data stream or file to improve throughput (i.e., maintain throughput above a throughput threshold), while minimizing the number Huffman calculations to maintain a target compression ratio (i.e., to maintain the compression ratio above a C/R threshold). In one or more embodiments, the compression ratio for each input block of a data stream is determined and different dynamic Huffman tables are calculated based on the current compression ratio associated with the current input block or data chunk being compressed. In this manner, different dynamic Huffman tables can be actively calculated and utilized to improve throughput (i.e., maintain throughput above a throughput threshold), while maintaining a target compression ratio.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer system comprising:
   a host system configured to run an application, the application outputting a compression request to compress a data stream having an initial data-representation size, the data stream comprised of a plurality of individual data chunks; and a hardware controller configured to compress the plurality of individual data chunks according to different encodings based on a compression ratio of each of the individual data chunks to generate a compressed data stream having a reduced data-representation size with respect to the initial data-representation size; the hardware controller including an accelerator configured to compress a given data chunk among the plurality of individual data chunks;

wherein the accelerator includes a Huffman table calculator that actively calculates a dynamic Huffman table based at least in part on a compression ratio of the given data chunk that is determined prior to compressing the given data chunk, and wherein the accelerator compresses the given data chunk according to the dynamic Huffman table corresponding to the calculated compression ratio of the given data chunk.

2. The computer system of claim 1, wherein the computer system further comprises:

an operating system (OS) configured to provide a communication interface between the hardware controller and the application and to exchange at least one data request block between the application and the hardware controller, the at least one data request block identifying the given data chunk to be compressed among the plurality of individual data chunks.

3. The computer system of claim 2, wherein the OS comprises a device driver including a compression ratio calculator configured to calculate the compression ratio of each of the individual data chunks, and sends the calculated compression ratio to the hardware controller prior to compressing the given data chunk.

4. The computer system of claim 3, wherein the accelerator loads the at least one data request block with encoding identification data indicating the calculated dynamic Huffman table corresponding to the given data chunk.

5. The computer system of claim 4, wherein the accelerator utilizes a newly calculated dynamic Huffman table when the compression ratio of the given data chunk is less than a compression ratio threshold value, and utilizes a previously calculated dynamic Huffman table when the compression ratio of the given data chunk is equal to or exceeds the compression ratio threshold value.

6. The computer system of claim 3, wherein the device driver determines a target compression ratio to maintain throughout the compression of the plurality of individual data chunks, and wherein the accelerator continuously changes the dynamic Huffman table to compress the plurality of individual data chunks while maintaining the target compression ratio.

7. A computer-implemented method of controlling a computer system to compress data, the method comprising:

outputting, via an application running on the computer system, a compression request to compress a data stream having an initial data-representation size;

generating a compressed data stream having a reduced data-representation size with respect to the initial data-representation size by compressing, via an accelerator included in a hardware controller of the computer system, a plurality of individual data chunks according to different encodings based on a compression ratio of each of the plurality of individual data chunks, wherein compressing the plurality of individual data chunks comprises:

determining the compression ratio of a given data chunk prior to compressing the given data chunk; and actively calculating a dynamic Huffman table, via a Huffman table calculator, based at least in part on the compression ratio of the given data chunk determined prior to compressing the given data chunk; and compressing the given data chunk using the calculated dynamic Huffman table corresponding to the compression ratio of the given data chunk.

8. The method of claim 7, further comprising exchanging, via an operating system (OS) of the computer system, at least one data request block between the application and the hardware controller to identify a given data chunk to be compressed among the plurality of individual data chunks.

9. The method of claim 7, wherein actively calculating a new dynamic Huffman table comprises calculating, via a compression ratio calculator of a device driver running on the OS, the compression ratio of each of the individual data chunks.

10. The method of claim 9, further comprising loading the at least one data request block with encoding identification data indicating the calculated dynamic Huffman table corresponding to the given data chunk.

11. The method of claim 10, further comprising:

utilizing a newly calculated dynamic Huffman table in response to determining the compression ratio of the given data chunk is less than a compression ratio threshold value; and utilizing a previously calculated dynamic Huffman table in response to determining the compression ratio of the given data chunk is equal to or exceeds the compression ratio threshold value.

12. The method of claim 9, further comprising:

determining, via the device driver, a target compression ratio to maintain throughout the compression of the plurality of individual data chunks, and continuously changing the dynamic Huffman table to compress the plurality of individual data chunks while maintaining the target compression ratio.

13. A computer program product to control a computer system to compress data, the computer program product comprising a computer readable storage medium having program instructions embodied therewith, the program instructions executable by an electronic computer processor to perform operations comprising:

outputting, via an application running on the computer system, a compression request to compress a data stream having an initial data-representation size;

generating a compressed data stream having a reduced data-representation size with respect to the initial data-representation size by compressing, via an accelerator included in a hardware controller of the computer system, a plurality of individual data chunks according to different encodings based on a compression ratio of each of the plurality of individual data chunks;

wherein compressing the plurality of individual data chunks comprises:

determining the compression ratio of a given data chunk prior to compressing the given data chunk; and actively calculating a new dynamic Huffman table, via a Huffman table calculator, based at least in part on the compression ratio of the given data chunk determined prior to compressing the given data chunk; and compressing the given data chunk using the calculated new dynamic Huffman table corresponding to the compression ratio of the given data chunk.

14. The computer program product of claim 13, wherein actively calculating a new dynamic Huffman table comprises calculating, via a compression ratio calculator of a device driver running on the OS, the compression ratio of each of the individual data chunks.

15. The computer program product of claim 14, further comprising loading the at least one data request block with encoding identification data indicating the calculated dynamic Huffman table corresponding to the given data chunk.

16. The computer program product of claim 15, further comprising:

utilizing a newly calculated dynamic Huffman table in response to determining the compression ratio of the given data chunk is less than a compression ratio threshold value; and utilizing a previously calculated dynamic Huffman table in response to determining the compression ratio of the given data chunk is equal to or exceeds the compression ratio threshold value.

17. The computer program product of claim 14, further comprising:

determining, via the device driver, a target compression ratio to maintain throughout the compression of the plurality of individual data chunks, and continuously changing the dynamic Huffman table to compress the plurality of individual data chunks while maintaining the target compression ratio.

* * * * *